US007453963B2

(12) United States Patent
Joublin et al.

(10) Patent No.: US 7,453,963 B2
(45) Date of Patent: Nov. 18, 2008

(54) SUBTRACTIVE CANCELLATION OF HARMONIC NOISE

(75) Inventors: Frank Joublin, Mainhausen (DE); Martin Heckmann, Frankfurt am Main (DE); Björn Schölling, Dieburg (DE)

(73) Assignee: Honda Research Institute Europe GmbH, Offenbach/Main (DE)

( * ) Notice: Subject to any disclaimer, the term of this patent is extended or adjusted under 35 U.S.C. 154(b) by 632 days.

(21) Appl. No.: 11/138,243

(22) Filed: May 25, 2005

(65) Prior Publication Data

US 2005/0276363 A1 Dec. 15, 2005

(30) Foreign Application Priority Data

May 26, 2004 (EP) .................................. 04012471
Oct. 19, 2004 (EP) .................................. 04024861

(51) Int. Cl.
*H03D 1/04* (2006.01)

(52) U.S. Cl. ....................... 375/346; 375/227; 375/254; 704/224; 704/228; 702/75; 702/189; 701/22

(58) Field of Classification Search ................. 455/337; 398/204, 202; 375/406.05, 254, 346, 227; 701/22; 702/75, 189; 704/224, 228
See application file for complete search history.

(56) References Cited

U.S. PATENT DOCUMENTS 4,677,668 A * 6/1987 Ardalan et al. ......... 379/406.05
6,006,082 A * 12/1999 Park et al. .................... 455/337
7,162,165 B2 * 1/2007 Szafraniec .................. 398/202
2004/0022547 A1 * 2/2004 Szafraniec .................. 398/204
2004/0118231 A1 * 6/2004 Peck ............................ 74/5.4
2005/0125114 A1 * 6/2005 Atmur ......................... 701/22

OTHER PUBLICATIONS

Ephraim, Y. et al., "Speech Enhancement Using a Minimum Mean-Square Error Short-Time Spectral Amplitude Estimator," IEEE Transactions on Acoustics, Speech, and Signal Processing, Dec. 1984, pp. 1109-1121, vol. ASSP-32, No. 6.

European Search Report, EP 04 02 4861, Nov. 8, 2005, 3 pages.

La Scala, B.F. et al., "Design of an Extended Kalman Filter Frequency Tracker," IEEE Transactions on Signal Processing, Mar. 1996, pp. 739-742, vol. 44, No. 3.

Parker, P. et al., "Frequency Tracking of Nonsinusoidal Periodic Signals in Noise," Elsevier Science Publishers B.V., 1990, pp. 127-152.

Pfitzinger, H.R., "Removing Hum from Spoken Language Resources," Department of Phonetics and Speech Communication, University of Munich, 4 pages.

Puder, H., "Speech Enhancement for Hands-Free Car Phones by Adaptive Compensation of Harmonic Engine Noise Components," Eurospeech 2003—Geneva, pp. 1397-1400.

(Continued)

*Primary Examiner*—Sudhanshu C Pathak
(74) *Attorney, Agent, or Firm*—Fenwick & West LLP

(57) ABSTRACT

A common problem in audio processing is that a useful signal is disturbed by one or more sinusoidal noises that should be suppressed. One embodiment of the invention provides a method of canceling a sinusoidal disturbance of unknown frequency in a disturbed useful signal. The method comprises the steps of estimating parameters of the sinusoidal disturbance including amplitude, phase and frequency; generating a reference signal on the basis of the estimated parameters; and subtracting the reference signal from the disturbed useful signal. According to one embodiment of the present invention, the estimation is performed by an Extended Kalman filter.

13 Claims, 3 Drawing Sheets

OTHER PUBLICATIONS

Woolfson, M.S. et al., "Adaptive Cancellation of Selected Harmonics from a Signal," IEE Proc.-Vis. Image Signal Process., Aug. 2001, pp. 295-303, vol. 148, No. 4.

"Voice Activity Detection (VAD) for Full Rate Speech Traffic Channels," European Telecommunications Standard Institute, ETSI, GSM 06.32, 1998, pp. 1-41.

* cited by examiner

Recursive estimation algorithm according to the Kalman-Filter:

(Step 1) Prediction of states:

$$\hat{\theta}(n|n-1) = \hat{\theta}(n-1|n-1)$$

(Step 2) Prediction error (Prediction of the covariance matrix of states):

$$M(n|n-1) = M(n-1|n-1) + Q$$

(Step 3) Kalman gain matrix:

$$K(n) = M(n|n-1)h(n)\left(h^T(n)M(n|n-1)h(n) + \sigma_w^2\right)^{-1}$$

(Step 4) Correction (Update of the state estimation):

$$\hat{\theta}(n|n) = \hat{\theta}(n|n-1) + K(n)\left(y(n) - h^T(n)\hat{\theta}(n|n-1\right)$$

(Step 5) Estimation error (Update of the covariance matrix of states):

$$M(n|n) = \left(I - K(n)h^T(n)\right)M(n|n-1)$$

Fig. 2

Recursive estimation algorithm according to the Extended Kalman-Filter:

(Step 1) Prediction of states:

$$\hat{\theta}(n|n-1) = \hat{\theta}(n-1|n-1)$$

(Step 2) Prediction error (Prediction of the covariance matrix of states):

$$M(n|n-1) = M(n-1|n-1) + Q$$

(Step 3b) Linearization transformation matrix:

$$\tilde{h}(n) = \frac{\partial h(\theta,n)}{\partial \theta}\Big|_{\theta(n)=\hat{\theta}(n|n-1)}$$

(Step 4b) Kalman gain matrix:

$$K(n) = M(n|n-1)\tilde{h}(n)\left(\tilde{h}^T(n)M(n|n-1)\tilde{h}(n) + \sigma_w^2\right)^{-1}$$

(Step 5b) Correction (Update of the state estimation):

$$\hat{\theta}(n|n) = \hat{\theta}(n|n-1) + K(n)\left(y(n) - h(\hat{\theta}(n|n-1),n)\right)$$

(Step 6b) Estimation error (Update of the covariance matrix of states):

$$M(n|n) = \left(I - K(n)\tilde{h}^T(n)\right)M(n|n-1)$$

Fig. 3

SUBTRACTIVE CANCELLATION OF HARMONIC NOISE

CROSS-REFERENCE TO RELATED APPLICATIONS

This application is related to and claims priority from European Patent Applications No. 04 012 471.1 filed on May 26, 2004 and 04 024 861.9 filed on Oct. 19, 2004, which are all incorporated by reference herein in their entirety.

FIELD OF THE INVENTION

The present invention relates to the field of noise suppression.

BACKGROUND OF THE INVENTION

A common problem in audio processing is that an information-bearing signal is disturbed by one or more sinusoidal signals. A conventional method for suppressing interfering signals is to use fixed notch filters tuned to the frequency of the sinusoidal interference, as described in "Halbleiter-Schaltungstechnik" by Ulrich Tietze and Christoph Schenk, Springer, 12th edition, 2002, which is incorporated by reference herein in its entirety.

For notch filtering, in order to cause only a slight degradation in the signal of interest, the filter's notch is required to be very sharp, and for a good suppression the frequency of the interference needs to be known precisely. If this is not the case, the usual method of notch filtering is no longer effective and an adaptive approach has to be used, as proposed in "Adaptive IIR Filtering in Signal Processing and Control" by Philip A. Regalia, Marcel Dekker, 1994, which is incorporated by reference herein in its entirety. In this approach, the filter synchronizes with the main sinusoidal interference that contains the most power and suppresses it completely. The filter is also able to track minor time-dependent changes of the interference frequency. However, the approach has a major drawback in that it does not preserve the spectral content of the information-bearing signal at the notch frequency. A clean separation of two sinusoids, one representing noise and the other representing useful information, is thus not possible.

SUMMARY OF THE INVENTION

According to one embodiment of the present invention, the above problems can be tackled by considering the sinusoidal interference suppression as a cancellation of the disturbances. According to one embodiment, an artificial reference signal is created and subtracted from the noisy information-bearing signal. The suppression according to one embodiment depends on the quality of the estimated values of the sinusoidal parameters for the reference signal.

According to one embodiment of the present invention, once good estimates have been found, the estimation process can be slowed down or completely stopped, such that the estimator does not track the changes in amplitude and phase caused by the signal of interest. According to one embodiment, the spectral content will be preserved as long as the parameters of the sinusoidal interference remain constant in time. According to another embodiment, if the parameters of the sinusoidal interference change, the usual estimation procedure is reactivated. Conventional methods assume known frequencies for the cancellation and most of them use gradient descent for a sequential parameter estimation of amplitude and phase, e.g. "Geräuschreduktionsverfahren mit modellbasierten Ansätzen für Freisprecheinrichtungen in Kraftfahrzeugen" by Henning Puder, PhD Thesis, Technische Universität Darmstadt, 2003, which is incorporated by reference herein in its entirety. According to one embodiment, to process speech signals, estimation of disturbing sinusoidal parameters is controlled by the step size of the descent and only activated during speech pauses, whereby suppression of useful spectral content in speech parts is greatly reduced.

An object of one embodiment of the present invention is to provide for an improved technique of noise cancellation that can also be applied in case the interference frequency is unknown. One embodiment of the present invention removes individual sinusoidal interferences from a disturbed voice signal by means of a compensation technique by using the in-phase/quadrature model for the sinusoidal interferences.

A method according to one embodiment of the present invention estimates and tracks one or more parameters of an interference, including in-phase amplitude, quadrature amplitude and frequency. A method according to another embodiment of the present invention estimates and tracks the following three parameters of an interference: in-phase amplitude, quadrature amplitude and frequency. According to one embodiment, estimation is performed recursively by an Extended Kalman-Filter. According to a further embodiment, on the basis of one or more parameters, for example the above three parameters, sinusoidal interferences are compensated in a disturbed signal by generating a reference signal and subtracting it from the disturbed signal.

According to one embodiment of the present invention, estimation of one or more unknown sinusoidal disturbance parameters is done sequentially by an Extended Kalman Filter. According to one embodiment, the filter converges—comparable to an adaptive notch filter—to a powerful frequency, for example the most powerful frequency, and estimates its parameters. According to another embodiment, the parameter estimation procedure is controlled by choosing different values for the assumed measurement and plant noise covariance in the Kalman framework. For example, a high value in the measurement covariance fixes the estimated values and the reference signal. A further embodiment of the present invention has the advantage that it is not necessary to know the frequency of the interference and, in contrast to the adaptive notch filter, no signal information is eliminated.

According to one embodiment, the respective values for the initialization of the Kalman filter and for the variance of signals and interference are determined by additional sensors, for example a revolution counter of a motor in the case of suppression of a motor noise. According to another embodiment, they are determined by a learning procedure during which possible disturbances, interferences, and/or noises and their properties are identified. According to a further embodiment, the values thereby determined are not exact values of the frequencies of the interference but only estimation values thereof, which are useful for speeding-up the Kalman filter adaptation and for improving the accuracy of the estimation.

According to a further embodiment of the present invention, continuous sensor information after initialization is integrated in the filtering process by adding separate measurement equations. A sensor fusion of a revolution counter and other devices can thus be accomplished.

One embodiment of the invention provides a method of canceling a sinusoidal disturbance of unknown frequency in a disturbed useful signal. The method comprises the steps of estimating parameters of the sinusoidal disturbance including amplitude, phase and frequency; generating a reference signal on the basis of the estimated parameters; and subtracting the reference signal from the disturbed useful signal.

According to one embodiment of the present invention, estimating the parameters of the sinusoidal disturbance is initialized with values of one or more additional sensors and/or of a learning procedure.

According to one embodiment of the present invention, a number of sinusoidal disturbances are canceled by repeating the method according to one embodiment of the present invention. For example, a number of sinusoidal disturbances are canceled by repeating the method according to one embodiment of the present invention in series.

According to one embodiment of the present invention, the disturbed useful signal is band-pass filtered before estimating the parameters of the sinusoidal disturbance. According to another embodiment, the disturbed useful signal is decomposed into one or more bands by one or more band-pass filters before the method according to one embodiment of the present invention is applied to each band. According to a further embodiment, a reference signal is generated for canceling the sinusoidal disturbance in a first band, a sinusoidal disturbance is canceled in the first band, and the sinusoidal disturbance is also canceled in a second band by means of the reference signal generated for canceling the given sinusoidal disturbance in the first band. According to a still further embodiment, the sinusoidal disturbance is canceled in the second band by adapting the reference signal generated for canceling the given sinusoidal disturbance in the first band to the ratio of the first band frequency response to the second band frequency response.

According to one embodiment of the present invention, estimating the parameters of a sinusoidal disturbance is performed by an extended Kalman filter. According to another embodiment, a confidence in initialization values of estimating the parameters of the sinusoidal disturbance is adapted. According to a further embodiment, the confidence is adapted by controlling the error covariance matrix of the extended Kalman filter.

According to one embodiment of the present invention, the method according to one embodiment of the present invention is executed time-selectively. According to a further embodiment, the method according to one embodiment of the present invention is executed time-selectively on the basis of a voice activity measurement.

According to one embodiment of the present invention, subtracting a reference signal from a disturbed useful signal generates an obtained estimated signal. According to a further embodiment, an obtained estimated signal is filtered according to the method of Ephraim and Malah.

One embodiment of the present invention provides a computer software program product implementing the techniques of one embodiment of the present invention when running on a computing device.

Another embodiment of the present invention provides a system for canceling a sinusoidal disturbance of unknown frequency in a disturbed information-bearing signal, comprising a computing device designed to perform the techniques of the present invention.

DESCRIPTION OF THE DRAWINGS

FIG. 2 shows a recursive Kalman estimation algorithm according to one embodiment of the present invention.

FIG. 3 shows a recursive extended Kalman estimation algorithm according to one embodiment of the present invention.

DETAILED DESCRIPTION OF THE PREFERRED EMBODIMENTS

Figure 1:
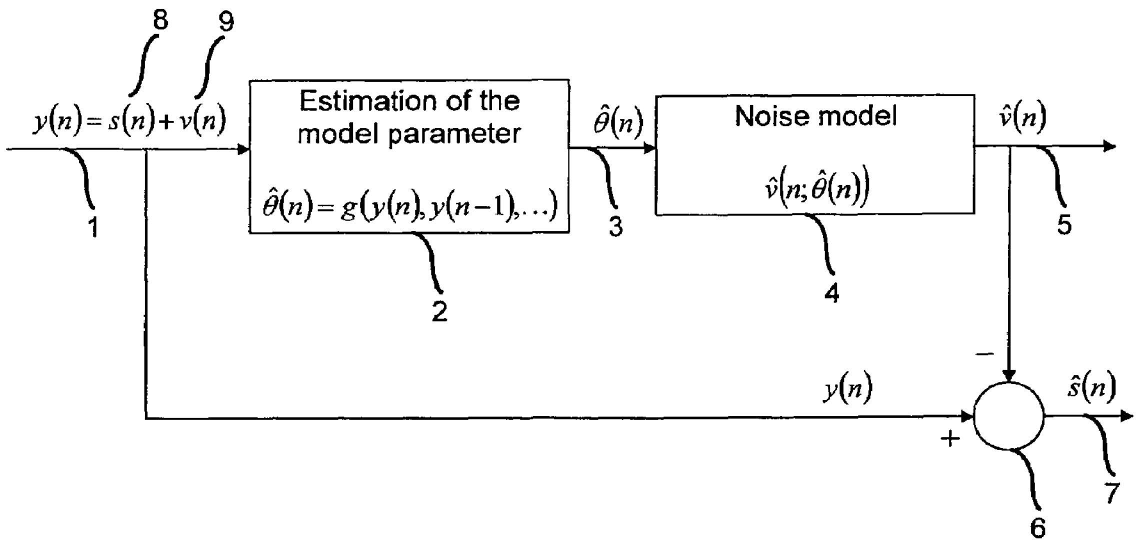
FIG. 1 shows a technique for elimination of a noise from a disturbed signal by adding a reference signal according to one embodiment of the present invention.

One embodiment of the present invention provides a method for canceling additive sinusoidal disturbances with unknown frequencies in a signal of interest. One embodiment of the present invention applies to enhancing audio signals. Another embodiment of the present invention is applied to signals of a pressure sensor.

FIG. 1 shows a technique for elimination of a noise from a disturbed signal by adding a reference signal according to one embodiment of the present invention. As shown in FIG. 1, a method according to one embodiment of the present invention estimates 2 and tracks one or more parameters for each interference, such as the following parameters: in-phase amplitude, quadrature amplitude and frequency. According to one embodiment, the estimation is performed recursively by an Extended Kalman-Filter. According to a further embodiment, on the basis of one or more estimated parameters 3, such as the three above parameters, a reference signal 5 is generated 4 and subtracted 6 from a disturbed signal 1, such that the sinusoidal interference 9 is compensated in the disturbed signal 1.

According to one embodiment of the present invention, the reference signal that is utilized is an artificial signal 5 $\hat{v}(n, \hat{\theta})$ produced on the basis of a noise model 4. According to a further embodiment, the artificial signal 5 represents an estimated value of the actual disturbing noise 9 v(n) that superimposes the information-bearing signal 8 s(n). According to another embodiment, the estimation 2 of said reference takes place indirectly by determining the model-parameter/s in equation 1 below.

$$\hat{\theta}=[\hat{\theta}_1, \hat{\theta}_2 \ldots, \hat{\theta}_n]^T \qquad \text{Eq. 1}$$

According to one embodiment, a noise 9 is suppressed by subtracting 6 the artificial model 5 $\hat{v}(n, \hat{\theta})$ from the entire disturbed signal 1 y(n) as shown in equation 2 below.

$$\hat{s}(n)=y(n)-\hat{v}(n)=s(n)+v(n)-\hat{v}(n)=s(n)+e(n) \qquad \text{Eq. 2}$$

In equation 2, e(n) is the error signal after noise compensation at time n, s(n) is the useful at time n, $\hat{s}(n)$ is the estimated useful signal at time n, v(n) is the interfering noise at time n, $\hat{v}(n)$ is the estimated interfering noise at time n, and y(n) is the additive disturbed useful at time n.

According to one embodiment of the present invention, an appropriate model to deal with the compensation of sinusoidal oscillations is the in-phase/quadrature model. According to one embodiment, a sinusoidal signal v(n) is given by equation 3 below, and is described in the model by the three parameters in equations 4a, 4b, and 4c below, representing respectively the in phase component, the quadrature component and the normalized frequency.

$$v(n)=A\cos(2\pi\tilde{f}n+\phi) \qquad \text{Eq. 3}$$

$$\theta_1=A\cos\phi \qquad \text{Eq. 4a}$$

$$\theta_2=A\sin\phi \qquad \text{Eq. 4b}$$

$$\theta_3=\tilde{f} \qquad \text{Eq. 4c}$$

According to one embodiment of the present invention, generation of a reference signal is described by equation 5 below.

$$v(n, \theta)=\theta_1\cos(2\pi\theta_3 \cdot n)-\theta_2\sin(2\pi\theta_3 \cdot n) \qquad \text{Eq. 5}$$

One embodiment of the present invention eliminates drawbacks of notch filtering. One embodiment of the present invention allows to specifically attenuate determined oscillations instead of completely deleting them. Constant and persistent oscillations of the useful signal can thereby be preserved. One embodiment of the present invention allows to track temporarily changes in the interference frequencies by a constant estimation $\hat{\theta}(n)$ of the model parameters on the basis of the input signal and the last evaluated values, wherein the estimation is given by equation 6 below.

$$\hat{\theta}(n)=f(y(n), y(n-1), \ldots \hat{\theta}(n-1), \hat{\theta}(n-2), \ldots) \quad \text{Eq. 6}$$

The results obtained according to one embodiment of the present invention depend on the accuracy of the estimators 2 as well as on the possibility to differentiate between the useful signal 8 and the noise signal 9. According to one embodiment of the present invention, constant new estimation 2 is used so that small estimation errors in the phase or in the frequency do not lead after a period of time to large errors in the subtraction between the reference and the noise signal. In order to keep computing costs at a low level, a further embodiment of the present invention proposes to use a sequential method.

Kalman-Filter

The following section will explain, with reference to FIGS. 2 and 3, how the one embodiment of the present invention makes use of a sequential estimation method that is the Kalman-Filter.

According to one embodiment of the present invention, in order to calculate the current estimation value $\hat{\theta}(n)$ the Kalman-Filter uses the current sample value $y(n)=s(n)+v(n)$ of a disturbed signal, the last estimation $\hat{\theta}(n-1)$ of one or more parameters and information about the precision of the estimation in the form of an error covariance matrix $M(n-1|n-1)$. According to one embodiment, the filter has the positive feature that it provides the best linear estimation results for parameters $\theta(n)$ that are linearly changing with time, as seen in "Fundamentals of Statistical Signal Processing—Estimation Theory", Steven M. Kay, Signal Processing Series, Prentice Hall, 1993, which is incorporated by reference herein in its entirety. According to one embodiment, best estimation means that the Kalman-Filter minimizes the expected quadratic error of all linear estimators, i.e. the linear minimum mean square error (LMMSE).

The following section explains how the general Kalman equations are adapted to subtractive cancellation of harmonic noise according to one embodiment of the present invention.

According to one embodiment of the present invention, as a standard approach uses a linear dynamic model, it is at first assumed that one parameter, which is the frequency $\theta_3=\tilde{f}_0$, is known. In describing the use of the Extended Kalman-Filter below according to one embodiment of the present invention, existing equations are modified and a frequency estimation is added.

According to one embodiment, the parameters $\theta(n)$ to estimate are state variables of a system and their change with time is modeled by a linear stochastic system.

$$\theta(n)=A\cdot\theta(n-1)+B\cdot u(n),\ n\geqq 0 \quad \text{Eq. 7}$$

$$\begin{bmatrix}\theta_1(n)\\ \theta_2(n)\end{bmatrix} = \begin{bmatrix}1 & 0\\ 0 & 1\end{bmatrix}\cdot\begin{bmatrix}\theta_1(n-1)\\ \theta_2(n-1)\end{bmatrix} + \begin{bmatrix}1 & 0\\ 0 & 1\end{bmatrix}\cdot u(n) \quad \text{Eq. 8}$$

According to one embodiment of the present invention, in equation 8 $\theta_1(n)$ and $\theta_2(n)$ designate a currently in phase or quadrature component of the sinusoidal disturbance and u(n) is normal distributed zero-mean two-dimensional white noise.

$$u\sim N(0, Q) \quad \text{Eq. 9}$$

According to one embodiment, channels $u_1(n)$ and $u_2(n)$ are uncorrelated to each other and have the same variance.

$$Q=\text{diag}\,[\sigma_u^2\ \sigma_u^2] \quad \text{Eq. 10}$$

According to a further embodiment, the parameters $\theta(n)$ can be observed via the disturbed noise signal 1 y(n), as shown in equation 11 below.

$$\begin{aligned} y(n) &= \theta_1(n)\cos(2\pi\tilde{f}_0\cdot n) - \theta_2(n)\sin(2\pi\tilde{f}_0\cdot n) + w(n) \\ &= h^T(n)\theta(n) + w(n). \end{aligned} \quad \text{Eq. 11}$$

According to one embodiment shown in equation 11, w(n) expresses the influence of a voice signal 8 s(n) on the measure of the noise signal 9 v(n), as shown in equation 12 below.

$$v(n) = h^T(n)\theta(n) = \left[\cos(2\pi\tilde{f}_0\cdot n) - \sin(2\pi\tilde{f}_0\cdot n)\right]\cdot\begin{bmatrix}\theta_1(n)\\ \theta_2(n)\end{bmatrix} \quad \text{Eq. 12}$$

According to one embodiment of the present invention, a "voice noise" w(n) can be statistically described by its mean value $\mu_w(n)$ and its variance $\sigma_w^2(n)$. Note that the assumption of a Gaussian distribution does not hold for the voice signal. Consequently, although the Kalman Filter may not produce the best results in the sense of a minimum mean square error (MMSE), it provides the best values for a linear estimation method (LMMSE). FIG. 2 shows a recursive Kalman estimation algorithm resulting from the above definitions and assumptions according to one embodiment of the present invention.

According to one embodiment of the present invention, the initialization comprises setting the values $\hat{\theta}(-1|-1)$ and $M(-1|-1)$. According to one embodiment, the algorithm begins with n=0. One embodiment of the present invention uses the parameter θ at the moment n=−1 as starting value for the mean value and for the covariance. According to another embodiment of the present invention, as it is difficult to assign statistical data to the parameters, it is proposed by the present invention to use a reasonable guess for $\theta(-1|-1)$ as the beginning value. The confidence in said start value is determined by $M(-1|-1)$. For the estimation of the in-phase or quadrature component, one embodiment of the present invention uses $[0\ 0]^T$ as "mean value". One embodiment of the present invention uses the error covariance matrix in equation 13 below, in which the likely estimation range is hardly restricted.

$$M(-1|-1) = \begin{bmatrix}\sigma^2 & 0\\ 0 & \sigma^2\end{bmatrix}\ \sigma^2 = 100 \quad \text{Eq. 13}$$

According to one embodiment of the present invention, if substantial smaller values are chosen for $\sigma^2$, then the algorithm can look for the "right" parameters $\theta(n)$ in the range of the beginning values during a certain period of time. According to another embodiment, if the algorithm does not find said parameters, it changes only slowly its "search direction". According to a further embodiment, the filter is exposed to a very strong "bias".

According to one embodiment of the present invention, tracking of the amplitude values $\theta_1(n)$ and $\theta_2(n)$ can be controlled via a covariance matrix Q. According to one embodiment of the present invention the matrix Q is diagonal as shown in equation 14 below, such that independent changes of both amplitude components are allowed. According a further embodiment of the present invention, a suitable value for the background noise is $\sigma_u^2 = 10^{-13}$. Note that very large values would lead to a behavior that looks like that of the notch filter.

$$Q = \text{diag}\,[\sigma_u^2, \sigma_u^2] \qquad \text{Eq. 14}$$

Extended Kalman-Filter

FIG. 3 shows a recursive extended Kalman estimation algorithm according to one embodiment of the present invention.

One embodiment of the present invention allows filter frequency changes to be tracked by adding a third recursive equation for the frequency to the Kalman-Filter algorithm presented in FIG. 2. According to one embodiment of the present invention, the Kalman-Filter synchronizes itself on an oscillation having a variable frequency and tracks and compensates timely changes. A problem with carrying out this amendment in the field of usual Kalman theory is that equation 15 below is not linear in the frequency-range.

$$\begin{aligned} y(n) &= \theta_1 \cos(2\pi\theta_3 n) - \theta_2 \sin(2\pi\theta_3 n) + w(n) \\ &= h(\theta(n), n) + w(n) \end{aligned} \qquad \text{Eq. 15}$$

According to one embodiment of the present invention, the sequential estimation equations of the Kalman-Filter can nevertheless be utilized. According to one embodiment, by applying a Taylor-series approximation, the term $h(\theta(n),n))$ can be linearized. According to a further embodiment, the reference model $h(\theta, n)$ can thus be developed around the estimation value $\hat{\theta}(n|n-1)$ as described in equation 16 below.

$$\begin{aligned} h(\theta(n), n) &\approx h(\hat{\theta}(n \mid n-1)) + \\ &\quad \frac{\partial h}{\partial \theta(n)}\bigg|_{\theta(n)=\hat{\theta}(n|n-1)} (\theta(n) - \hat{\theta}(n \mid n-1)) \\ &= h(\hat{\theta}(n \mid n-1), n) + \tilde{h}(n)^T \cdot (\theta(n) - \hat{\theta}(n \mid n-1)) \end{aligned} \qquad \text{Eq. 16}$$

Therefore, according to one embodiment, Eq. 15 can be represented by equation 17 below.

$$\begin{aligned} y(n) &= h(\hat{\theta}(n \mid n-1), n) + \tilde{h}(n)^T \cdot \\ &\quad (\theta(n) - \hat{\theta}(n \mid n-1)) + w(n) \\ &= \tilde{h}(n)^T \theta(n) + w(n) + \\ &\quad (h(\hat{\theta}(n \mid n-1), n) - \tilde{h}(n)^T \hat{\theta}(n \mid n-1)) \\ &= \tilde{h}(n)^T \theta(n) + w(n) + z(n) \end{aligned} \qquad \text{Eq. 17}$$

Note that equation 17 is now linear and differs from the Kalman-model, as shown in equation 11, by the known term in equation 18 below.

$$z(n) = h(\hat{\theta}(n|n-1), n) - \tilde{h}(n)^T \hat{\theta}(n|n-1) \qquad \text{Eq. 18}$$

According to one embodiment of the present invention, by means of the transformation $y'(n)=y(n)-z(n)$ one obtains the same beginning prerequisites as those of a normal Kalman-Filter. When using the Kalman-Filter approach, the estimation algorithm called Extended Kalman-Filter (EKF) and shown in FIG. 3 is obtained.

According to one embodiment of the present invention, the prediction steps 1 and 2 remain unchanged, except that the number of parameters has been increased by one to three. According to a further embodiment, the frequency has been added to the parameters in-phase/quadrature components. According to a still further embodiment, the three other equations of the Kalman-Filter algorithm in steps 4*b*, 5*b* and 6*b* show slight changes. According to one embodiment of the present invention, the equation, which carries out the correction of the predicted estimation value on the basis of the new measured value $y(n)$, uses the non-linear signal model $h(\hat{\theta}(n|n-1), n)$ to predict the expected measured value $\hat{y}(n|n-1)$ in step 5*b*. According to a further embodiment, the amplification/gain in step 4*b* and/or the estimation error in step 6*b* use the first order linearization $\tilde{h}(n)$, which is computed for each new step. Note that one embodiment of the present invention does not perform an off-line computation of the course of the gain and the error, such as for the linear Kalman-Filter. Further on, the filter may lose its linear optimality characteristic because the linearization and the estimation error $M(n|n)$ is interpreted as being a first order approximation of the actual error.

Sub-Band Decomposition

In the following section, the sub-band decomposition carried out by one embodiment of the present invention is explained.

According to one embodiment of the present invention, suppression is not directly performed on a disturbed voice signal 1 $y(n)$. One embodiment of the present invention carries out at first a sub-band decomposition, which is the first step of the subtractive cancellation of harmonic noise. Its function simulates the neural signal processing of the human cochlea. According to one embodiment, the noise suppression then takes place at a neural higher level and uses the signal filtered by the cochlea.

According to one embodiment of the present invention, a model that shows good results is the gammatone filter bank proposed by Patterson. See the technical report of Malcom Slaney "An efficient implementation of the Patterson Holdsworth auditory filter bank", Apple Computer Inc, 1993, which is incorporated by reference herein in its entirety. According to one embodiment, said filter bank is composed of different band-pass filters of order 8, wherein the filters have different bandwidths and different center frequency distances to each other. According to a further embodiment, the bandwidths as well as the distances or band-overlaps are defined on the basis of a psycho-acoustic analysis and they increase with an increasing frequency.

For the example of simulating the cochlea of a robot-head according to one embodiment of the present invention, it is proposed to use a version of said gammatone filter bank with 100 channels. In the different band-limited channels of the filter bank, a noise reduction of the sinusoidal disturbances is accomplished. According to one embodiment, depending on the disturbance frequency, the suppression may be carried out in more than one channel, since the same attenuated disturbance can be present in the overlapping adjacent channels, in which case the disturbance frequency is then suppressed in the other channels too. Although this implies additional work in comparison with direct processing, i.e. notch filtering, the compensation technique according to the present invention profits from the sub-band decomposition. According to one embodiment, sinusoidal interferences that are close together are separated by the decomposition. According to another embodiment, the filter bank shows a low channel width particularly for deep frequencies such that it separates the sinusoidal oscillations having a high power, for example the 100 Hz and 200 Hz oscillations of the network humming.

According to one embodiment of the present invention, the estimation procedure is carried out in one channel. According to a further embodiment, the channel selected is the one having the largest amplitude course for the given initial frequency. According to another embodiment, a fixed relation between the transfer functions of the main and co-channels allows then to produce suitable artificial reference noises for the other channels.

The compensation method according to one embodiment of the present invention differs from a notch filtering through two features: first, it requires only a limited preliminary knowledge of the frequency to compensate, i.e. the algorithm converges automatically to a powerful frequency in the vicinity of the initial values; secondly, it can prevent the extended Kalman filter from removing voice portions of the same frequency by controlling the model noise parameters $\sigma_w^2(n)$ and Q(n).

One embodiment of the present invention realizes this control by means of a voice-activity-detection (VAD) method. Note that such methods are used in the mobile communication field. For example, see "Voice-Activity Detector", ETSI Rec. GSM 06.92, 1989, which is incorporated by reference herein in its entirety. According to one embodiment, said detection method determines a threshold value. Above the threshold value, for example when the voice is present in the signal, the parameter estimation is stopped by giving a high value to the measurement noise, for example $\sigma_w^2=10^4$. The parameter estimation and tracking starts again under the threshold value, i.e. when the voice is no longer present in the signal.

According to one embodiment of the present invention, information from different sensor sources, for example revolution counters, is included by adding separate measurement equations. Therefore, according to one embodiment it is possible to track frequency values even during speech and the estimation need not to be stopped.

According to one embodiment of the present invention, several extended Kalman filters are further connected in series. According to one embodiment, a first filter eliminates a powerful sinusoidal disturbance, for example the most powerful sinusoidal disturbance, in the signal or in a given frequency band of the signal. According to a further embodiment, the obtained signal is then supplied to a second filter that suppresses another powerful sinusoidal disturbance, for example the second most powerful sinusoidal disturbance, etc.

One embodiment of the present invention executes a further step in order to suppress a remaining disturbing signal. For example, after the compensation steps, the signal can be filtered according to the method of Ephraim and Malah, which is described in the document "Speech enhancement using a minimum mean-square error short-time spectral amplitude estimator" by Yariv Ephraim and David Malah, IEEE Transactions on Acoustics, Speech and Signal Processing, 32(6), December 1984, which is incorporated by reference herein in its entirety.

The present invention may be embodied in various forms and should not be construed as limited to the embodiments set forth herein. Rather, these embodiments are provided so that disclosure will be thorough and complete and will fully convey the invention to those skilled in the art. Further, the apparatus and methods described are not limited to rigid bodies. While particular embodiments and applications of the present invention have been illustrated and described herein, it is to be understood that the invention is not limited to the precise construction and components disclosed herein and that various modifications, changes, and variations may be made in the arrangement, operation, and details of the methods and apparatuses of the present invention without department from the spirit and scope of the invention as it is defined in the appended claims.

What is claimed is:

1. A method of canceling a sinusoidal disturbance of unknown frequency in a disturbed useful signal, comprising the steps of:

(a) estimating parameters of the sinusoidal disturbance, including an amplitude, a phase and a frequency;

(b) generating a reference signal on the basis of the estimated parameters; and (c) subtracting the reference signal from the disturbed useful signal;

wherein the disturbed useful signal is band-pass filtered before estimating the parameters of the sinusoidal disturbance; and wherein the disturbed useful signal is decomposed into one or more bands by one or more band-pass filters prior to performing steps (a)-(c) to each band; wherein generating a reference signal comprises: generating a reference signal for a first band; and further generating a reference signal for a second band by adapting the reference signal generated in the first band to a ratio of a first band frequency response to a second band frequency response.

2. The method of claim 1, wherein estimating the parameters of the sinusoidal disturbance is initialized with a value of a sensor or a learning procedure.

3. The method of to claim 1, wherein information from an additional sensor is integrated as an additional measurement equation in a Kalman formalism.

4. The method of claim 1, wherein a plurality of sinusoidal disturbances are canceled by repeating the steps (a)-(c).

5. A method according to claim 1, wherein the reference signal for the first band is generated for canceling the sinusoidal disturbance in the first band, the sinusoidal disturbance is canceled in the first band, and the sinusoidal disturbance is canceled in the second band by means of the reference signal generated for the second band.

6. The method of claim 1, wherein estimating the parameters of the sinusoidal disturbance is performed by an extended Kalman filter.

7. The method of claim 1, wherein a confidence in initialization values of estimating the parameters of the sinusoidal disturbance is adapted.

8. The method of claim 7, wherein estimating the parameters of the sinusoidal disturbance is performed by an extended Kalman filter and the confidence is adapted by controlling an error covariance matrix of the extended Kalman filter.

9. The method of claim 1, wherein the method is executed time-selectively.

10. The method of claim 1, wherein the method is executed time-selectively on the basis of a voice activity measurement.

11. The method of claim 1, wherein subtracting the reference signal from the disturbed useful signal generates an obtained estimated signal and wherein the obtained estimated useful signal is filtered according to a method of Ephraim and Malah.

12. A computer readable medium embodying a computer program, the program comprising instructions for implementing the method of claim 1 when running on a computing device.

13. A system for canceling the sinusoidal disturbance of unknown frequency in the disturbed useful signal, comprising a computing device is designed to implement the method of claim 1.

* * * * *